United States Patent
Lin et al.

(10) Patent No.: US 10,217,750 B1
(45) Date of Patent: Feb. 26, 2019

(54) BURIED WORD LINE STRUCTURE AND METHOD OF MAKING THE SAME

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Ger-Pin Lin, Tainan (TW); Kuan-Chun Lin, Tainan (TW); Chi-Mao Hsu, Tainan (TW); Shu-Yen Chan, Changhua County (TW); Shih-Fang Tzou, Tainan (TW); Tsuo-Wen Lu, Kaohsiung (TW); Tien-Chen Chan, Tainan (TW); Feng-Yi Chang, Tainan (TW); Shih-Kuei Yen, Tainan (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou, Fujian province (CN)

( * ) Notice: Subject to any disclaimer, the term of this patent is extended or adjusted under 35 U.S.C. 154(b) by 0 days.

(21) Appl. No.: 15/712,133

(22) Filed: Sep. 21, 2017

(30) Foreign Application Priority Data

Aug. 31, 2017 (CN) .......................... 2017 1 0770218

(51) Int. Cl.
*H01L 27/108* (2006.01)
*H01L 21/28* (2006.01)

(52) U.S. Cl.
CPC .. *H01L 27/10876* (2013.01); *H01L 21/28088* (2013.01); *H01L 21/28097* (2013.01); *H01L 27/10823* (2013.01)

(58) Field of Classification Search
CPC ......... H01L 27/10823; H01L 27/10876; H01L 27/10891
See application file for complete search history.

(56) References Cited

U.S. PATENT DOCUMENTS

| 8,008,144 | B2 | 8/2011 | Ananthan |
| 8,153,489 | B2 | 4/2012 | Song |
| 8,466,052 | B2 | 6/2013 | Baek |
| 8,546,858 | B2 | 10/2013 | Jang |
| 9,972,628 | B1* | 5/2018 | Goswami .......... H01L 27/10876 |

* cited by examiner

*Primary Examiner* — Mark Prenty
(74) *Attorney, Agent, or Firm* — Winston Hsu

(57) ABSTRACT

A method of fabricating a buried word line structure includes providing a substrate with a word line trench therein. Two source/drain doped regions are disposed in the substrate at two sides of the word line trench. Later, a silicon oxide layer is formed to cover the word line trench. A titanium nitride layer is formed to cover the silicon oxide layer. Next, a tilt ion implantation process is performed to implant silicon atoms into the titanium nitride layer to transform part of the titanium nitride layer into a titanium silicon nitride layer. A conductive layer is formed in the word line trench. Subsequently, part of the conductive layer, part of the titanium silicon nitride layer and part of the silicon oxide layer are removed to form a recess. Finally, a cap layer fills in the recess.

4 Claims, 9 Drawing Sheets

(a)

(b)

(a)

(b)

BURIED WORD LINE STRUCTURE AND METHOD OF MAKING THE SAME

BACKGROUND OF THE INVENTION

1. Field of the Invention

The present invention relates to a buried word line structure and a method of fabricating the same, and more particularly to a buried word line structure which reduces the gate-induced drain leakage (GIDL) problem.

2. Description of the Prior Art

As device geometries shrink, reliability problems due to gate induced drain leakage forces the integrated circuit to operate at voltages which are lower than desired for best performance. When the device is biased, gate induced drain leakage results from the generation of electron-hole pairs in the surface of the depletion region of a transistor along the area where the gate conductor overlaps the drain diffusion region, such that the drain potential is more positive than the gate potential.

DRAM is a commonly-seen memory and is widely used in computers and other electronic appliances. DRAM includes a memory cell array composed of capacitors to store data. In a DRAM array, gate induced drain leakage degrades data retention time.

Therefore, there is a need to produce a structure which eliminates the gate induced drain leakage problem.

SUMMARY OF THE INVENTION

According to a preferred embodiment of the present invention, a method of fabricating a buried word line structure comprises: providing a substrate with a word line trench therein, and two source/drain doped regions disposed in the substrate at two sides of the word line trench. Later, a silicon oxide layer is formed to cover the word line trench. Then, a titanium nitride layer is formed to cover the silicon oxide layer. Subsequently, a tilt ion implantation process is performed to implant silicon atoms into the titanium nitride layer to transform part of the titanium nitride layer into a titanium silicon nitride layer. Next, a conductive layer is formed in the word line trench. After that, part of the conductive layer, part of the titanium silicon nitride layer and part of the silicon oxide layer are removed to forma recess. Finally, a cap layer is formed to fill in the recess.

According to another preferred embodiment of the present invention, a buried word line structure includes a substrate. A word line trench is disposed within the substrate, wherein the word line trench comprises a first trench and a second trench connected to the first trench. The first trench comprises an opening and a first sidewall. The second trench comprises a second sidewall and a bottom wherein a width of the opening is greater than the width of the bottom, and the second sidewall includes an arced corner; the arced corner connects to the first sidewall. A silicon oxide layer covers the second trench, wherein a thickness of the silicon oxide layer contacting the arced corner is greater than a thickness of the silicon oxide layer contacting the bottom. A word line is disposed within the second trench. A cap layer is disposed in the first trench. Two source/drain doped regions are in the substrate at two sides of the word line.

According to yet another preferred embodiment of the present invention, a method of fabricating a buried word line structure comprises providing a substrate having a doped region. Next, a first trench is formed in the doped region and separates the doped region into two source/drain doped regions. Then, a mask layer is formed to cover a sidewall of the first trench. Subsequently, the substrate is etched to form a second trench by taking the mask layer and the source/drain doped regions as a mask, wherein the first trench and the second trench forma step profile. After forming the second trench, the mask layer is removed entirely. Later, an oxidation process is performed to form a silicon oxide layer covering the first trench and the second trench. Finally, a word line is formed in the first trench and the second trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 depict a method of fabricating a buried word line according to a preferred embodiment of the present invention, wherein:
FIG. 2 is a fabricating stage following FIG. 1;
FIG. 3(a-c) are fabricating stages following FIG. 2;
FIG. 4 is a fabricating stage following FIG. 3(b);
FIG. 5 is a fabricating stage following FIG. 4; and
FIG. 6 is a fabricating stage following FIG. 5.
FIG. 7 to FIG. 14 depict a fabricating method of a buried word line structure according to another preferred embodiment of the present invention, wherein:
FIG. 8 is a fabricating stage following FIG. 7;
FIG. 9 is a fabricating stage following FIG. 8;
FIG. 10 is a fabricating stage following FIG. 9;
FIG. 11 is a fabricating stage following FIG. 10;
FIG. 12(a-b) are fabricating stages following FIG. 11;
FIG. 13(a-b) are fabricating stages following FIG. 12(a-b); and
FIG. 14 is a fabricating stage following FIG. 13(a).

DETAILED DESCRIPTION

Figure 1:
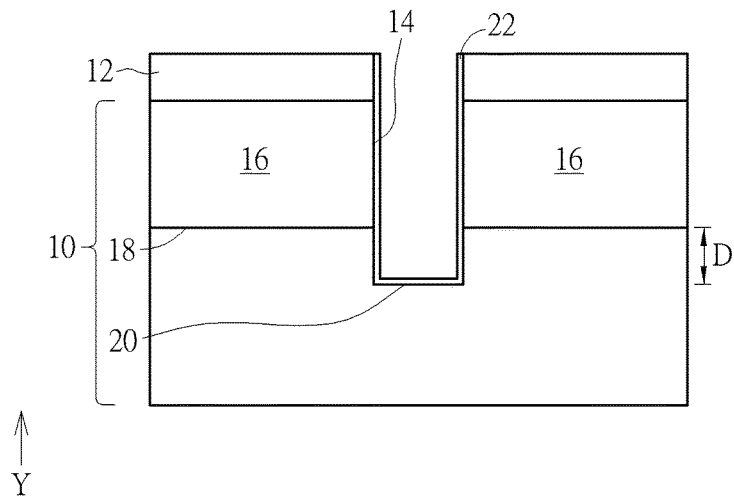

FIG. 1 to FIG. 6 depict a method of fabricating a buried word line according to a preferred embodiment of the present invention. As shown in FIG. 1, a substrate 10 is provided. The substrate 10 includes a silicon substrate or a germanium silicon substrate. A mask layer 12 covers the substrate 10. The mask layer 12 may be silicon oxide, silicon nitride, silicon oxynitride or other insulating materials. Later, an ion implantation process is performed to form a doped region within the substrate 10. In this embodiment, the dopants implanted into the substrate 10 are N-type. In other embodiment, the dopants implanted into the substrate 10 are P-type. Then, the mask layer 12 is patterned. Subsequently, the substrate 10 is etched to form a word line trench 14 by taking the mask layer 12 as a mask. The word line trench 14 separate the doped region into two source/drain doped regions 16, i.e. the source/drain doped regions 16 are respectively at two sides of the word line trench 14. Each of the source/drain doped regions 16 has a bottom 18. The word line trench 14 also has a bottom 20. A distance D along a vertical direction Y is disposed between the bottom 18 and the bottom 20. The vertical direction Y is perpendicular to the top surface of the substrate 10. The top surface of the substrate 10 contacts the mask layer 12.

Figure 2:
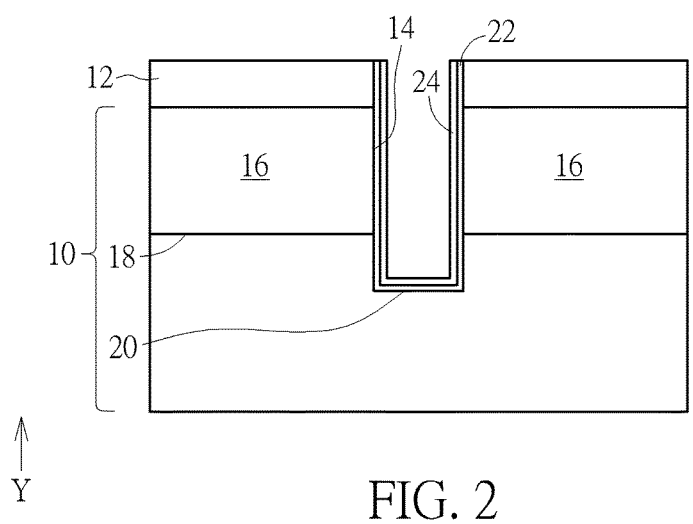
Figure 3:
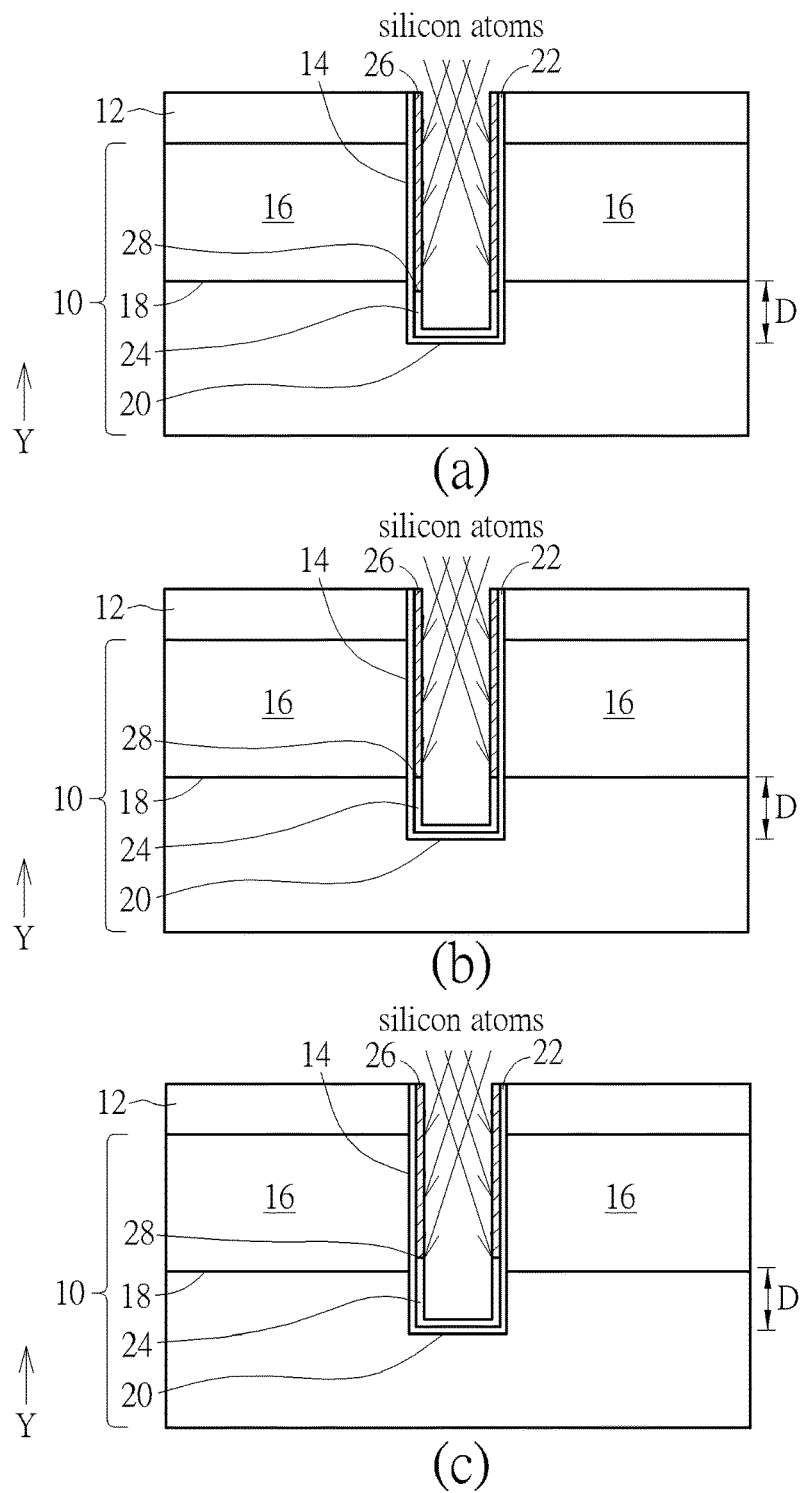

A silicon oxide layer 22 is formed to cover the inner sidewall of the word line trench 14. The silicon oxide layer 22 may be formed by an in situ steam generation (ISSG)

process, a deposition process or a thermal oxidation process. As shown in FIG. 2, a titanium nitride (TiN) layer 24 is formed to contact and cover the silicon oxide layer 22. The TiN layer 24 may be formed by a deposition process. The TiN layer 24 also covers the top surface of the mask layer 12. Later, the TiN layer 24 on the top surface of the mask layer is removed, and the TiN layer 24 in the word line trench 14 remains. As shown in FIG. 3(a-c), a tilt ion implantation process is performed to implant silicon atoms into the TiN layer 24 to transform part of the TiN layer 24 into a titanium silicon nitride (TiSiN) layer 26. By adjusting the angle of the ion implantation process and taking the mask layer 12 as a mask, the mask layer 12 provides a shadowing effect, and the range of the silicon atoms which are implanted can be altered. Therefore, the length of the TiSiN layer 26 on the sidewall of the word line trench 14 can be adjusted. Example (a), example (b) and example (c) illustrated in FIG. 3 show this in detail. A length of the TiSiN layer 26 in example (a) is the longest. A length of the TiSiN layer 26 in example (c) is the shortest. A length of the TiSiN layer 26 in example (b) is longer than the TiSiN layer 26 in example (c) but shorter than the TiSiN layer 26 in example (a). Furthermore, because of the shadowing effect, silicon atoms are not implanted into the TiN layer 24 at the bottom 20 of the word line trench 14, and part of the TiN layer 24 at the sidewall of the word line trench 14.

An interface 28 is formed between the TiN layer 24 and the TiSiN layer 26. In example (a), the interface 28 is lower than the bottom 18 of the source/drain doped regions 16. Furthermore, a distance between the interface 28 and the bottom 18 along the vertical direction Y is smaller than 0.2 times of the distance D. In example (b), the interface 28 aligns with the bottom 18 of each of the source/drain doped regions 16. In example (c), the interface 28 is higher than the bottom 18 of each of the source/drain doped regions 16. Furthermore, a distance between the interface 28 and the bottom 18 along the vertical direction Y is smaller than 0.2 times of the distance D. According to a preferred embodiment of the present invention, the position of the interface 28 in example (b) is a preferred position. Subsequent figures take the position of the interface 28 in example (b) as an example. The tilt angle of the tilt ion implantation process is preferably between 5 and 20 degrees. The tilt angle refers to the angle between the path of the silicon atoms and the normal line of the top surface of the substrate 10. The concentration of silicon atoms is between 5E13 and 1E16 atoms/cm$^2$. The implant energy of the silicon atoms is between 0.2 and 30 kev. The tilt angle, the concentration of silicon atoms, and the implant energy can be altered based on different requirements.

Figure 4:
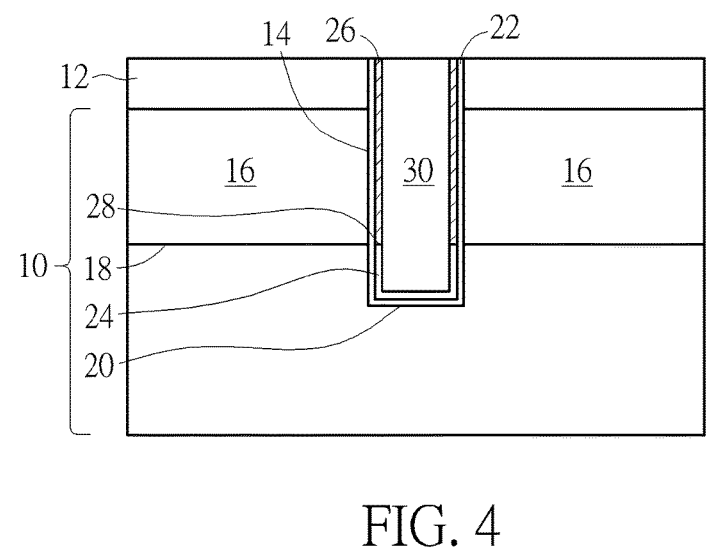
Figure 5:
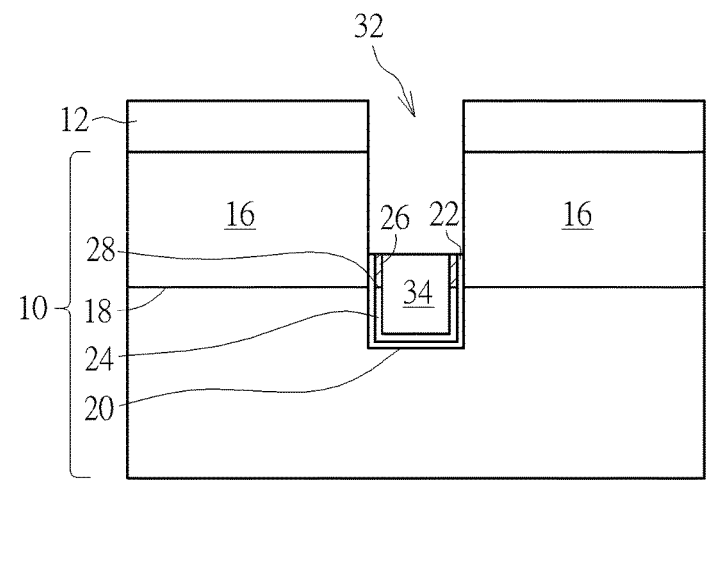
Figure 6:
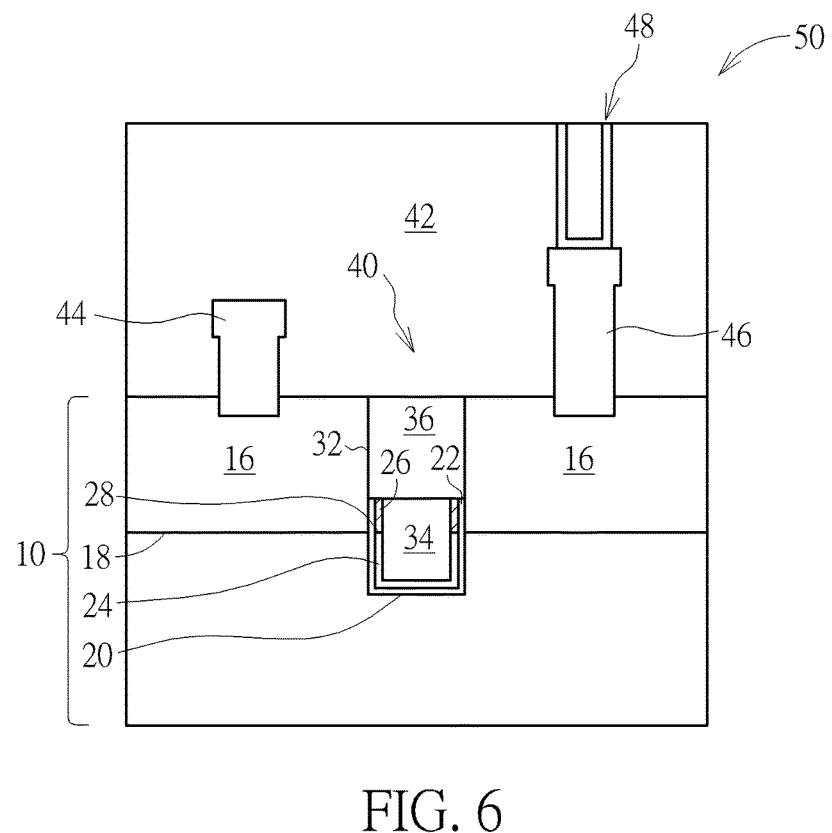

As shown in FIG. 4, a conductive layer 30 is formed to fill in the word line trench 14. The conductive layer 30 includes tungsten, copper or aluminum. As shown in FIG. 5, part of the conductive layer 30, part of the TiSiN layer 26, and part of the silicon oxide layer 22 are removed to form a recess 32. The recess 32 is part of the word line trench 14. The remaining conductive layer 30 serves as a word line 34. The remaining TiSiN layer 26 serves as a barrier layer which can reduce the GIDL problem. The TiN layer 24 serves as a work function layer for an N-type semiconductor. As shown in FIG. 6, a cap layer 36 is formed to fill in the recess 32. The cap layer 36 may be silicon nitride or other insulation materials. At this point, an N-type buried word line structure 40 is completed. Then, the mask layer 12 is removed. In other embodiments, the mask layer 12 can remain. Later, an interlayer dielectric 42, a bit line contact plug 44, a capacitor plug 46 and a capacitor 48 are formed. At this point, a dynamic random access memory (DRAM) 50 of the present invention is completed.

In the present invention, the silicon atoms are implanted into the TiN layer 24 to make part of the TiN layer 24 become the TiSiN layer 26. The TiSiN layer 26 is formed by a tilt ion implantation process, and the range of the TiSiN layer 26 can be adjusted by altering the tilt angle of the tilt ion implantation process. Therefore, no extra mask is used in the process of forming the TiSiN layer 26. The work function value of the TiN layer 24 is around 4.5 ev, and the work function value of the TiSiN layer 26 is around 4.2 ev. Because the work function value of the TiSiN layer 26 is lower than the work function value of the TiN layer 24, it is harder to form an electric field between the TiSiN layer 26 and the source/drain doped regions 16 than to form an electric field between the TiN layer 24 and the source/drain doped regions 16. Therefore, the TiSiN layer 26 can lower the GIDL problem.

Figure 7:
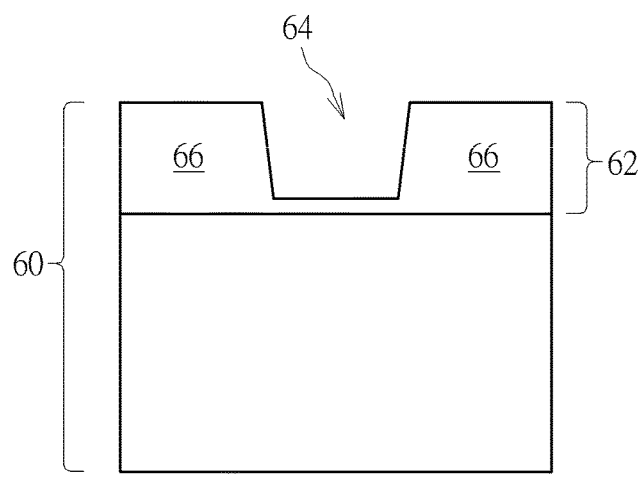
Figure 8:
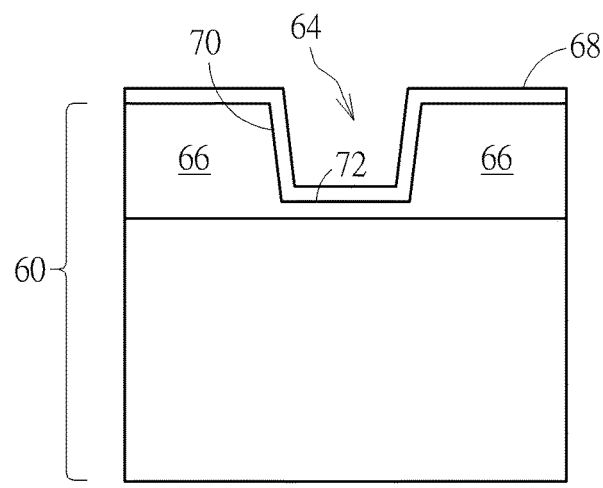

FIG. 7 to FIG. 14 depict a fabricating method of a buried word line structure according to a preferred embodiment of the present invention. As shown in FIG. 7, a substrate 60 is provided. The substrate 60 includes a silicon substrate or a silicon germanium substrate. Then, an implantation process is performed to form a doped region 62 within the substrate 60. The dopants used in the implantation process are N-type dopants. In other embodiments, however, the dopants can be P-type. Later, a first trench 64 is formed within the doped region 62. The first trench 64 separates the doped region 62 into two source/drain doped regions 66. As shown in FIG. 8, a deposition process is performed to form a mask layer 68 which conformally covers a sidewall 70 and a bottom 72 of the first trench 64, and covers the top surface of the source/drain doped region 66. The mask layer 68 is preferably silicon nitride or titanium nitride. The deposition process can be an atomic layer deposition (ALD), a chemical vapor deposition (CVD), or a physical vapor deposition (PVD).

Figure 9:
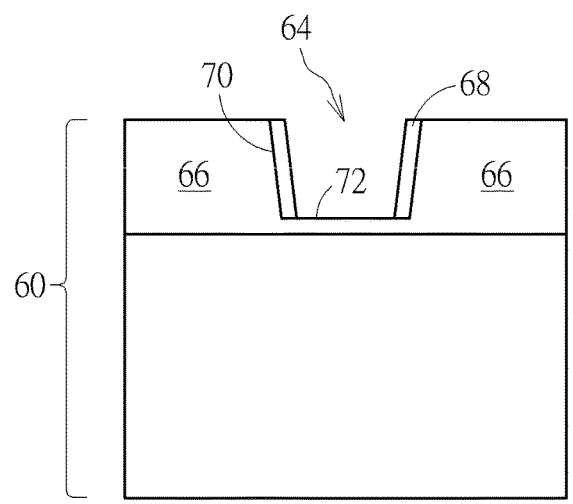
Figure 10:
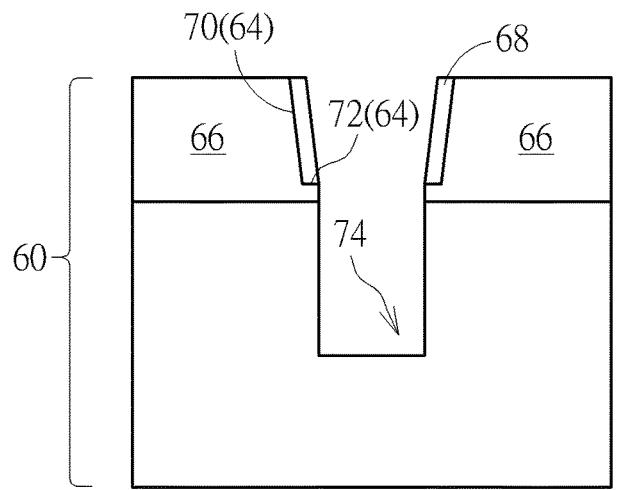
Figure 11:
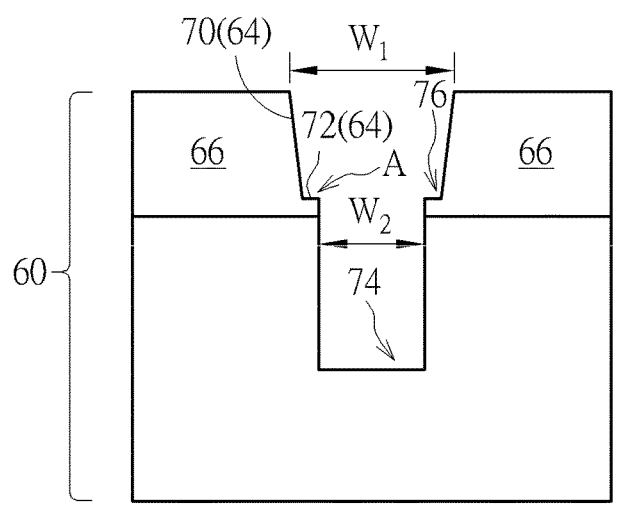

As shown in FIG. 9, the mask layer 68 on the top surface of the source/drain doped regions 66 and on the bottom 72 of the first trench 64 is removed, and the mask layer 68 on the sidewall 70 of the first trench 64 remains. As shown in FIG. 10, the substrate 60 at the bottom 72 of the first trench 64 is etched to form a second trench 74 by taking the mask layer 68 and the source/drain doped regions 66 as a mask. The first trench 64 connects to the second trench 74. As shown in FIG. 11, the mask layer 68 is entirely removed, and the sidewall 70 of the first trench 64 is exposed. It is noteworthy that a width $W_2$ of an opening of the second trench 74 is smaller than a width $W_1$ of an opening of the first trench 64. The difference between the width $W_1$ and the width $W_2$ equals the thickness of the mask layer 68. Therefore, the greater the thickness of the mask layer 68, the smaller the width $W_2$ becomes. Moreover, because the width $W_1$ and the width $W_2$ are different, the connecting region between the first trench 64 and the second trench 74 forms a step profile 76.

Figure 12:
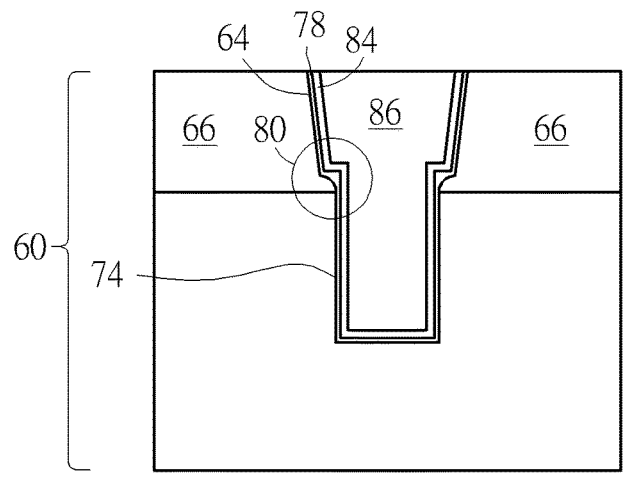
Figure 12:
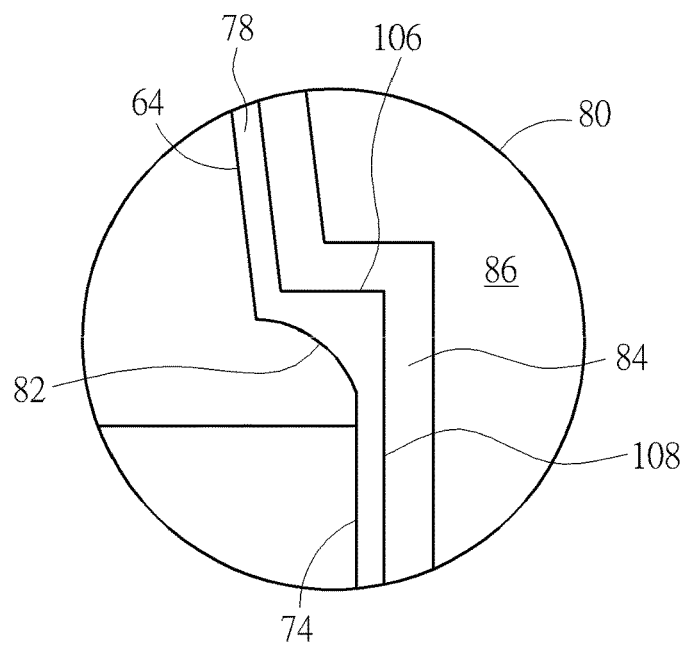

As shown in FIG. 12(a-b), an oxidation process is performed to oxidize the surface of the first trench 64 and the second trench 74 to form a silicon oxide layer 78 covering the first trench 64 and the second trench 74. The example (a) in FIG. 12 continues from FIG. 11. The example (b) in FIG. 12 is an enlarged view of the position 80 in example (a). Please refer to FIG. 11 and FIG. 12(a-b). During the oxidation process, a pointed edge A on the step profile 76 is oxidized faster than the flat surface on the step profile 76. The step profile 76 is oxidized to become an arced corner 82.

The silicon oxide layer 78 which contacts the arced corner 82 is thicker than the silicon oxide layer 78 which contacts other positions of the first trench 64 and the second trench 74. The silicon oxide layer 78 has the same thickness except for the part of the silicon oxide layer 78 which contacts the arced corner 82. Next, a work function layer 84 and a conductive layer 86 are formed to fill in the first trench 64 and the second trench 74. The work function layer 84 may be titanium nitride. The conductive layer 86 may be tungsten, copper or aluminum.

Figure 13:
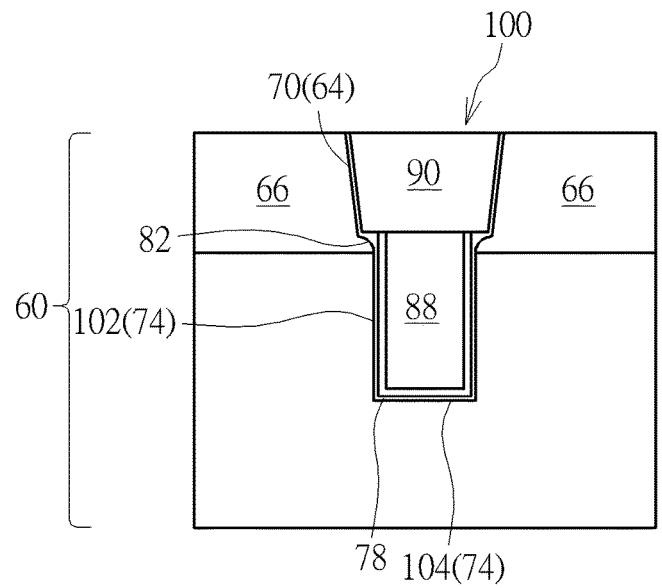
Figure 13:
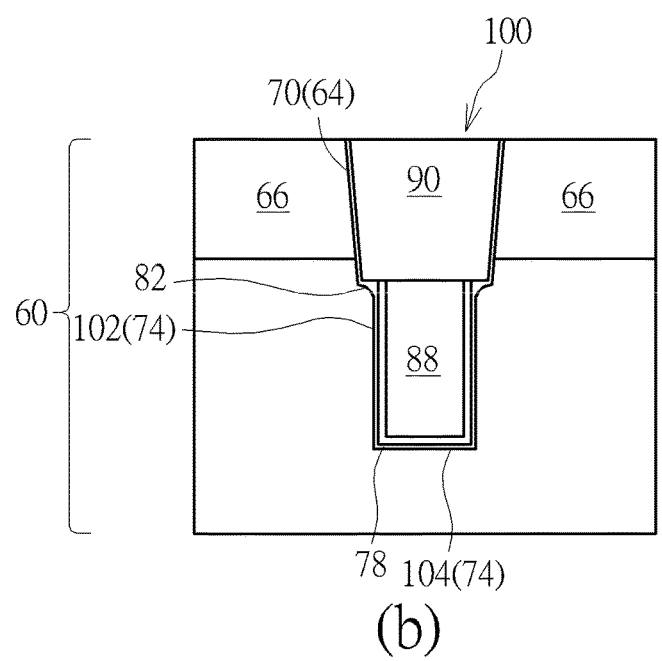

As shown in example (a) in FIG. 13, the work function layer 84 and the conductive layer 86 in the first trench 64 are removed. The conductive layer 86 which remains in the second trench 74 serves as a word line 88. The silicon oxide layer 78 in the first trench 64 can optionally be removed. In this embodiment, the silicon oxide layer 78 is kept. Later, a cap layer 90 fills in the first trench 64. At this point, the buried word line 100 of the present invention is completed.

Figure 14:
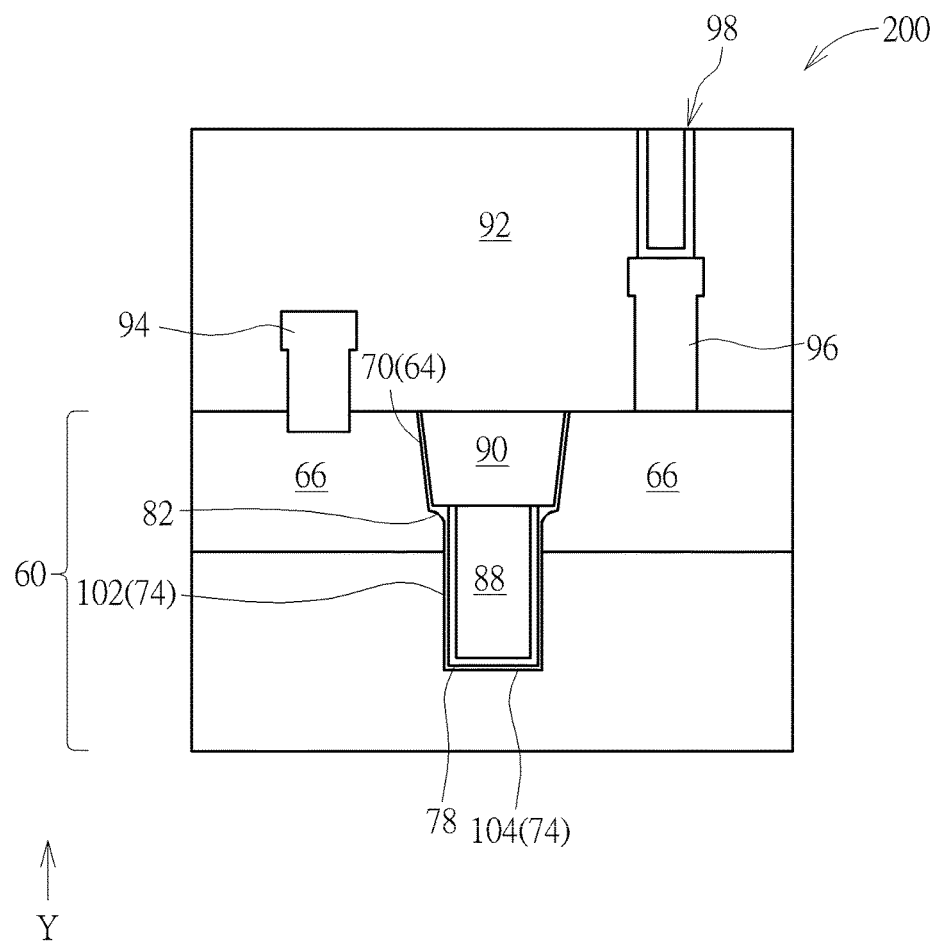

In FIG. 11, the pointed edge A on the step profile 76 is within the source/drain doped regions 66, and the arced corner 82 in example (a) of FIG. 13 is also within the source/drain doped regions 66. By adjusting the depth of the first trench 64 formed in FIG. 9, the position of the arced corner 82 can be adjusted. For example, as shown in example (b) of FIG. 13, the arced corner 82 is within the substrate 60 below the source/drain doped regions 66. As shown in FIG. 14, which continues from example (a) in FIG. 13, an interlayer dielectric 92, a bit line plug 94, a capacitor plug 96 and a capacitor 98 are formed. At this point, a DRAM 200 of the present invention is completed.

As shown in FIG. 13(a-b), a buried word line 100 includes a substrate 60, a word line trench disposed in the substrate 60. The word line trench includes a first trench 64 and a second trench 74. The first trench 64 connects to the second trench 74. The first trench 64 includes an opening and a sidewall 70. The second trench 64 includes a sidewall 102 and a bottom 104. Referring to FIG. 11, before the oxidation process, the width $W_1$ of the opening of the first trench 64 is greater than the width $W_2$ of the opening of the second trench 74. The width of the bottom 104 is the same as the width $W_2$ of the opening of the second trench 74. Therefore, the width $W_1$ of the opening of the first trench 64 is greater than the width of the bottom 104 of the second trench 74. The second sidewall 102 includes an arced corner 82. The arced corner 82 connects to a first sidewall 70. A silicon oxide layer 78 covers the second trench 74. A thickness of the silicon oxide layer 78 contacting the arced corner 82 is larger than a thickness of the silicon oxide layer 78 contacting the bottom 104. A word line 88 is disposed in the second trench 74. A cap layer 90 is in the first trench 64. Two source/drain doped regions 66 are respectively disposed in the substrate 60 at two sides of the word line 88. Refer to example (b) of FIG. 12. The silicon oxide layer 78 contacting the arced corner 82 includes a top surface 104 and a side surface 108. The top surface 104 and the side surface 108 form a right angle. As shown in example (a) of FIG. 13, the arced corner 82 is within the source/drain doped regions 66. As shown in example (b) of FIG. 13, the arced corner 82 is within the substrate 60 below the source/drain doped regions 66.

According to the present invention, the first trench 64 and the second trench 74 are formed in sequence by taking the mask layer 68 as a mask. Therefore, a step profile 76 can be formed. Next, the arced corner 82 is formed by oxidized the step profile 76. The silicon oxide layer 78 formed on the arced corner 82 is thicker than the silicon oxide layer 78 on other positions of the first trench 64 and the second trench 74. Therefore, the silicon oxide layer 78 formed on the arced corner 82 can prevent the GIDL problem.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A buried word line structure, comprising:
   a substrate;
   a word line trench disposed within the substrate, wherein the word line trench comprises:
      a first trench comprising an opening and a first sidewall; and
      a second trench connecting to the first trench, wherein the second trench comprises a second sidewall and a bottom, a width of the opening is greater than the width of the bottom, the second sidewall comprises an arced corner, and the arced corner connects to the first sidewall;
   a silicon oxide layer covering the second trench, wherein a thickness of the silicon oxide layer contacting the arced corner is greater than a thickness of the silicon oxide layer contacting the bottom;
   a word line disposed within the second trench;
   a cap layer disposed in the first trench; and
   two source/drain doped regions in the substrate at two sides of the word line.

2. The buried word line structure of claim 1, wherein the arced corner is disposed within one of the two source/drain doped regions.

3. The buried word line structure of claim 1, wherein the arced corner is below one of the two source/drain doped regions.

4. The buried word line structure of claim 1, wherein the silicon oxide layer contacting the arced corner comprises a top surface and a side surface, and the top surface and the side surface form a right angle.

* * * * *